United States Patent [19]

Moran et al.

[11] Patent Number: 5,837,322
[45] Date of Patent: Nov. 17, 1998

[54] DEPOSITION OF POLYCRYSTALLINE DIAMOND FILM ON ZINC SULFIDE SUBSTRATE HAVING NITRIDE INTERLAYER

[75] Inventors: Mark B. Moran; Linda F. Johnson, both of Ridgecrest, Calif.; Karl A. Klemm, Largo, Fla.

[73] Assignee: The United States of America as represented by the Secretary of the Navy, Arlington, Va.

[21] Appl. No.: 914,010

[22] Filed: Aug. 11, 1997

Related U.S. Application Data

[63] Continuation of Ser. No. 702,208, May 16, 1991, Pat. No. 5,800,879.
[51] Int. Cl.⁶ ............................. C23C 16/26; C23C 16/34
[52] U.S. Cl. ...................... 427/249; 427/255.7; 427/299; 359/359
[58] Field of Search ................................. 427/249, 255.7, 427/122, 299; 359/359; 423/446

[56] References Cited

U.S. PATENT DOCUMENTS

| | | | |
|---|---|---|---|
| 4,734,339 | 3/1988 | Schachner et al. | 428/701 |
| 5,183,602 | 2/1993 | Raj et al. | 252/587 |
| 5,254,237 | 10/1993 | Snaper et al. | 204/298.41 |
| 5,365,345 | 11/1994 | Propst et al. | 359/359 |
| 5,387,310 | 2/1995 | Shiomi et al. | 117/101 |
| 5,496,596 | 3/1996 | Herb et al. | 427/577 |

OTHER PUBLICATIONS

Mirtich et al, J. Vac. Sci. Technol. A4(6), Nov./Dec. 1986 pp. 2680–2681.

*Primary Examiner*—Roy V. King
*Attorney, Agent, or Firm*—Stephen J. Church; David S. Kalmbaugh; Melvin J. Sliwka

[57] ABSTRACT

An adhering, continuous, polycrystalline diamond film is deposited on a zinc sulfide substrate by forming a refractory nitride interlayer directly on the substrate and then depositing diamond on the interlayer in a vacuum chamber containing a microwave activated mixture of hydrogen and a gas including carbon. The diamond film may be of optical quality and may be deposited without mechanical treatment or seeding of the zinc sulfide substrate or the nitride interlayer. However, diamond deposition may be facilitated by abrasion of the interlayer before diamond deposition.

10 Claims, No Drawings

DEPOSITION OF POLYCRYSTALLINE DIAMOND FILM ON ZINC SULFIDE SUBSTRATE HAVING NITRIDE INTERLAYER

CROSS REFERENCE TO RELATED APPLICATION

This application is a continuation of commonly owned U.S. patent application Ser. No. 07/702,208 which was filed 16 May 1991, now U.S. Pat. No. 5,800,879; and which is hereby incorporated by reference.

BACKGROUND OF THE INVENTION

1. Field of the Invention

The present invention pertains to coating processes using activated vapor deposition of plural coatings including diamond and nitrides.

2. Description of the Prior Art

The carbon allotrope diamond has many potential uses. Diamond has extreme hardness, resistance to thermal and mechanical shock, and transparency to a wide range of electromagnetic wavelengths from ultraviolet through visible and infrared radiation to microwaves. Diamond would thus be an unexcelled coating for transmitting, reflecting, and absorbing optical and microwave elements subjected to weather and high energy radiation.

Chemical vapor deposition (CVD) of a film of polycrystalline diamond from an activated gaseous mixture which includes a gas containing carbon is well-known and is more fully described in the above-referenced U.S. patent application Ser. No. 07/702,208. In CVD, atoms to be deposited on a substrate are provided in molecules of a gas present in a chamber containing gas at a pressure less than atmospheric; and the gas is activated while in contact with the substrate by microwave energy, a hot filament, electric discharge, or combustion so that the gas releases free radicals containing the atoms to be deposited on the substrate. Typically in CVD, no electric potential relative to the substrate is provided, and the substrate is maintained at a suitable temperature by electrical resistance or induction heating.

Diamond may be deposited by CVD over a wide range of conditions. The vacuum chamber may be maintained at a pressure of 0.1 to 100 Torr by pumping while providing new gaseous mixture. The substrate is maintained at 550° to 1100° C. In general higher pressures increase the rate of diamond deposition as do higher substrate temperatures up to 900 or 1000° C. A gas containing the carbon which forms the diamond is provided as small proportion of a gaseous mixture in the chamber, the balance of the gas being predominately hydrogen. The mixture may be activated by microwave energy at a frequency which excites the hydrogen molecule. The carbon containing gas is usually methane which is readily obtained in a pure state and is present in the mixture at a proportion less than 5% and, typically, 0.5% to 2%. However, the necessary carbon-containing free radicals may be obtained from vapors of other hydrocarbons, alcohols, or the like. It is known in diamond CVD to add a small amount of oxygen to the mixture of hydrogen and carbon containing gas, the proportion of oxygen being substantially less than that of methane. The oxygen serves to increase the rate and quality of diamond deposition by oxidizing graphite which, depending on the deposition conditions, may be deposited along with the diamond.

CVD of diamond films would appear to make the potential uses mentioned above practical. However, diamond films deposited heretofore by CVD on a non-diamond substrate do not adhere thereto sufficiently for practical purposes unless the substrate is first abraded, as with diamond grit, or seeded with diamond particles, as by such abrasion leaving diamond particles. As a result of such abrasion and/or seed particles, the substrate is irregular and the crystallites forming the deposited film are irregular in size and spacing, very defected, and without preferred crystal orientation. The substrate and diamond film of the prior art are thus too irregular for use as an optical coating although continuous and smooth polycrystalline films are well-suited as optical coatings. However, it is believed apparent to one skilled in the art that diamond deposition is facilitated by abrasion of the interlayer before diamond deposition and the resulting diamond film may be useful where optical perfection is not required.

The irregularities of some prior art CVD diamond films may be disadvantageous for mechanical protection even where optical and electrical properties are irrelevant. For example, a very thick diamond layer may be rapidly deposited using a plasma torch or jet in which the carbon containing gas, which may be a portion of a flame, is activated by discharging the gas through an electric arc. However, the resulting diamond layer is so irregular and the crystallites so imperfectly joined that the layer has, despite its thickness, relatively poor resistance to weathering. However, where CVD diamond deposition is carried out using other activation, as by microwaves, abrasion of a substrate or interlayer on which a diamond film is deposited may result in the film being fully satisfactory for mechanical protection as against abrasion, environmental impact, and weathering.

The deposition, in a chamber containing gas at a pressure less than atmospheric, of a film or layer of a material onto a substrate is also well-known. Such vacuum deposition may be carried out by sputtering where ions of a gas, typically argon heated by microwave energy, eject atoms to be deposited from a target of the material so that the freed atoms travel to an adjacent substrate and are deposited thereon. Movement of such freed atoms to the substrate may be motivated by a suitable electric potential between the target and substrate. An oxide or nitride of the target material may be deposited by including, respectively, oxygen or nitrogen in the gas in the chamber. Suitable materials, structures, temperatures, and pressures for sputtering deposition of oxides and nitrides of a variety of elements on a variety of substrate materials are readily available for selection by one skilled in the art of vacuum deposition.

Because of its infrared transmissivity, zinc sulfide is preferred for transmissive optical elements. However, zinc sulfide is relatively soft and brittle and sublimes at about 800° C. and thus has poor environmental resistance including poor resistance to thermal heating by air flow due to supersonic vehicle movement. Although silicon and other relatively hard and refractory substances are used as optical elements, these substances are relatively brittle and thus easily damaged by thermal and mechanical shock as from rain drop impact due to high vehicle speeds. An optical quality diamond film would provide environmental resistance for zinc sulfide and other optical materials; but, as before stated, such a film cannot be provided by prior art CVD processes. Optically somewhat imperfect diamond films on zinc sulfide where diamond deposition is facilitated by abrasion or seeding before deposition may, of course, be satisfactory for some purposes.

BRIEF SUMMARY OF THE INVENTION

In accordance with the above-referenced U.S. patent application Ser. No. 07/702,208, an adhering, continuous diamond film is formed on a substrate by depositing a relatively thin interlayer of a refractory nitride on the substrate and then depositing diamond directly onto the interlayer by chemical vapor deposition from microwave activated gas without mechanically treating or seeding the substrate or the interlayer. However, it is believed apparent that deposition of a adhering, continuous diamond film deposition on such a interlayer of a refractory nitride interlayer would be facilitated by such mechanical treatment or seeding.

In the present invention, an adhering, continuous diamond film, which may be of optical quality, is formed on a substrate of zinc sulfide or other material by depositing an interlayer of a nitride on the substrate and then depositing diamond directly onto the interlayer by chemical vapor deposition with or without mechanically treating or seeding the substrate or the interlayer, as by abrasion with diamond grit. Such a diamond film may be depositable on a zinc sulfide substrate if the substrate temperature is in a range of about 600° to about 800° C.

The diamond film is deposited as a layer of polycrystalline diamond on the nitride interlayer from a gaseous mixture of hydrogen and a gas, such as methane, containing carbon, the substrate and the interlayer being heated and the gaseous mixture being activated by microwave energy. The nitride is a refractory nitride, for example aluminum nitride or silicon nitride, so as to withstand the substrate temperature at which the diamond is deposited. Deposition of the diamond is facilitated by the addition of oxygen to the gaseous mixture, the oxygen being added after diamond is deposited to a sufficient thickness of to protect the nitride interlayer from oxidation.

It is therefore an object of the present invention to provide a diamond film which adheres well to a substrate.

Another object is to provide such a diamond film which is highly resistive to environmental effects.

Still another object is to provide a diamond film for materials which are relatively soft, brittle, or nonrefractory.

A further object is to provide a diamond film which is fully effective in satisfying the above and other objects and yet is convenient and economical to apply to a variety of substrate materials.

DETAILED DESCRIPTION OF THE INVENTION

Apparatus, materials, and operating conditions which are an environment for the present invention are not a part of the invention but are now briefly described. Such apparatus, materials, and conditions are well-known, and a representative such environment is more fully described in the above-identified U.S. patent application Ser. No. 07/702,208.

A representative vacuum chamber used in the practice of the present invention admits microwave energy at 2.45 GHz for resonance with hydrogen molecules to form a plasma ball of activated gas above a stage mounting a substrate and an interlayer on which diamond is deposited from the activated gas. The substrate may be heated by induction heating to a selected temperature, and the surface contacted by the plasma ball and undergoing diamond deposition is viewable through a window by an optical pyrometer for determining the exact temperature of such surface. A thermocouple engages the stage and is connected to an induction heater power source and controller for maintaining the stage at a selected temperature.

A DC power supply is connected so as to provide a selected DC bias voltage in a range of about positive 20 volts to about negative 80 volts between the vacuum chamber wall and the stage.

The chamber has a ring manifold for distributing feed gas to the chamber interior. The chamber is associated with a gage for precise measurement of the vacuum within the chamber; an exhaust system for maintaining a selected chamber pressure, typically 0.1 to 100 Torr, by pumping while feed gas is being provided to the chamber; and a gas supply system connected between the ring manifold and bottles which contain the gases hydrogen, methane, and oxygen used in representative CVD of diamond involving the present invention. The gas supply system is adapted to provide the chamber with a selected flow of any gas or of any predetermined mixture of gases from the bottles by valves individually interconnecting each bottle to the ring manifold.

In the present invention, a nitride interlayer is deposited on a substrate of any suitable material such as zinc selenide, and the diamond film is deposited directly on a nitride interlayer surface opposite the substrate. The nitride interlayer may be deposited directly on the substrate or may be deposited on an adhesion layer which is directly deposited on the substrate.

The subject invention involves the discovery by the applicants that, without either mechanical treatment, such as abrasion with diamond grit, or seeding with diamond particles, a continuous, adhering, polycrystalline diamond film is depositable on a substrate by CVD from an activated gaseous mixture including hydrogen and a gas providing the carbon for formation of diamond crystallites making up the film. Since such treatment or seeding are not required with the present invention, the smoothness, crystallite regularity, and continuity of the deposited film are not adversely affected by physical irregularities introduced in prior art CVD diamond deposition requiring such treatment and seeding. As a result, a diamond film deposited by CVD in accordance with the present invention may be suited for protective coatings or other uses in optical elements. However, it is believed apparent to one skilled in the art that diamond deposition on such an interlayer may be facilitated by mechanical treatment or seeding so that the resulting diamond film may also be useful where optical quality is not required as in mechanical protection without optical transmission or reflection.

The thermodynamic conditions for CVD deposition of diamond instead of graphite, where the diamond is deposited at a useful rate and with useful purity, require that the surface on which such deposition occurs be at 600° to about 1100° C. since lower temperatures result in substantially no deposition and higher temperatures result in the deposition of graphite only. It is apparent that a nitride used to form the interlayer must resist these deposition temperatures, and refractory nitrides such as aluminum nitride and silicon nitride are effective for this purpose. It is, of course, necessary that the refractory nitride be sufficiently thick and regular to allow substantial and regular diamond nucleation. If the nitride interlayer is too thin, it may be so damaged by the highly erosive activated hydrogen of the plasma ball that diamond nucleation does not occur. A nitride interlayer thickness of at least 500 to about 2500 angstrom units has been found satisfactory to resist this activated hydrogen and to allow the interlayer surface to be effectively cleaned by exposure to a plasma ball of substantially pure hydrogen prior to introducing methane to commence diamond deposition.

The thermodynamic conditions for CVD deposition of diamond are the same for the subject invention as in the above discussed prior art deposition of diamond by CVD from a gaseous mixture of hydrogen and a gas, such as methane, containing carbon which forms the diamond. The above-described conditions for CVD diamond deposition in the prior art also apply to CVD diamond deposition in accordance with the present invention. As a result, it is believed that, as in the prior art, the present invention may be also be practiced using carbon sources other than methane and may be practiced with any suitable apparatus, amount of microwave power for activation, or other source of activation energy.

It is apparent that a nitride used to form the interlayer must resist the deposition temperatures set forth above of at least about 600° C.; that is, the nitride must be refractory or resistant to heat. The present invention has been effectively practiced with the refractory nitrides aluminum nitride and silicon nitride; and it is believed that other refractory nitrides, for example but not limited to, boron nitride, hafnium nitride, zirconium nitride, tantalum nitride, niobium nitride, vanadium nitride, and titanium nitride, may be equally effective for the practice of the present invention.

The refractory nitride interlayer may be deposited by sputtering; and such an interlayer has been formed of silicon nitride or aluminum nitride deposited by the well-known RF diode sputtering process on a substrate of silicon or silicon carbide, an adhesion layer of silicon dioxide being formed directly on the substrate in the same RF diode process before deposition of the nitride. The adhesion layer need only have a thickness of about 50 to 100 angstrom units.

It is necessary in the practice of the subject invention that the refractory nitride be sufficiently thick and regular to allow substantial and regular diamond nucleation. If the nitride interlayer is too thin, it may be so damaged by the highly erosive activated hydrogen of the plasma ball that such nucleation does not occur. In the practice of the present invention, a thickness for interlayer of at least 500 angstrom units is satisfactory. This thickness allows the surface on which diamond is to be deposited to be effectively cleaned by exposure to a plasma ball of substantially pure hydrogen for a few minutes prior to introduction of methane to commence diamond deposition.

It has been found that the above-described use of oxygen in the gaseous mixture when methane is initially introduced may result in such oxidation of the nitride interlayer that no diamond film is deposited thereon. However, the gaseous mixture may be provide without oxygen at the beginning of diamond deposition so that the nitride interlayer is not oxidized, and then, after a sufficient thickness of diamond has been deposited to protect the nitride, introducing oxygen into the mixture to promote faster growth and purity of the diamond subsequently deposited.

It has been found advantageous while depositing a diamond film such as that of the present invention to provide a bias voltage between the substrate and the vacuum chamber walls. Under typical conditions for effective diamond film deposition giving the substrate a bias of about 20 volts positive in relation to the wall has been found to promote more rapid growth of smaller and more regular crystallites.

The subject invention is, typically, carried out using a refractory nitride interlayer about 2500 angstrom units in thickness; however, it is believed by the applicants that such a layer of refractory nitride material of any practical thickness may be coated with a diamond film in accordance with the subject invention.

The principles of the subject invention may thus be employed for deposition of a protective or other diamond coating on zinc sulfide, which as before stated sublimes at about 800° C. by sputtering a nitride interlayer on a substrate of zinc sulfide under well-known conditions which avoid damage to the zinc sulfide substrate, and then and in accordance with the present invention, depositing a diamond layer on the interlayer using temperatures in the range of about 600 to about 800° C. which will not result in damage to the zinc sulfide substrate.

Under CVD conditions which have been found effective for deposition of a continuous diamond film on refractory nitride material in accordance with the present invention, the applicants have attempted to deposit a diamond film directly on a silicon dioxide adhesion layer, on a silicon substrate, and on silicon carbide films deposited by both RF diode sputtering and by DC magnetron sputtering; but a continuous diamond film failed to form. It is believed evident that these failures to form a continuous diamond film were due to the absence of a nitride layer on the silicon dioxide, silicon, or silicon carbide.

Therefore, it is believed apparent that the subject invention in its broadest aspect involves the deposition of diamond by CVD on any nitride material sufficiently refractory to withstand the temperature at which deposition occurs and sufficiently uniform for widespread nucleation of diamond crystallites and that deposition may be facilitated by mechanical treatment or seeding of the interlayer before diamond deposition where the resulting diamond film need not be optically perfect.

Although the present invention is effective in the production of a layered structure—such as an optical element having a polycrystalline diamond film deposited directly on a refractory nitride interlayer which is deposited on a substrate such as zinc sulfide—it will be apparent to one skilled in the art that the invention is not limited to an optical element. It will also be apparent that in an article of manufacture having a diamond layer deposited in accordance with a method embodying the present invention, the diamond layer may itself have subsequently deposited thereon an additional layer or coating; that a substrate may itself be deposited on a base substrate; and that, after deposition of the diamond layer, any or all of the interlayers and substrate may be removed, as by etching, leaving the diamond layer and any unremoved interlayer.

It is evident that many other modifications and variations are possible in light of the above teachings. It is, therefore, to be understood that within the scope of the following claims the invention may be practiced other than as specifically set forth in the above description.

What is claimed is:

1. A method of forming a continuous, polycrystalline, diamond layer on a zinc sulfide substrate, the method comprising depositing a refractory nitride layer on said zinc sulfide substrate and subsequently depositing said diamond layer directly on said nitride layer from activated gas containing carbon, wherein during said depositing of said nitride layer on said zinc sulfide substrate and during said depositing of said diamond layer on said nitride layer, said zinc sulfide substrate is at a temperature greater than 600 degrees centigrade and less than a temperature resulting in damage to said zinc sulfide substrate.

2. The method of claim 1 wherein said nitride layer is abraded with diamond grit before depositing said diamond layer on said nitride layer.

3. A method of forming an infrared transmissive element having a continuous, polycrystalline, diamond layer on a zinc sulfide substrate, the method comprising depositing a refractory nitride layer on said zinc sulfide substrate and subsequently depositing said diamond layer directly on said nitride layer from activated gas containing carbon, wherein during said depositing of said nitride layer on said zinc sulfide substrate and during said depositing of said diamond layer on said nitride layer, said zinc sulfide substrate is at a temperature greater than 600 degrees centigrade and less than a temperature resulting in damage to said zinc sulfide substrate.

4. The method of claim 3 wherein said nitride is a compound of an element of Group IIIA of the Periodic Table.

5. The method of claim 4 wherein said element of Group IIIA of the Periodic Table is selected from the group consisting of boron or aluminum.

6. The method of claim 5 wherein said element of Group IIIA of the Periodic Table is aluminum.

7. The method of claim 3 wherein said nitride layer is abraded with diamond grit before depositing said diamond layer on said nitride layer.

8. The method of claim 4 wherein said nitride layer is abraded with diamond grit before depositing said diamond layer on said nitride layer.

9. The method of claim 5 wherein said nitride layer is abraded with diamond grit before depositing said diamond layer on said nitride layer.

10. The method of claim 6 wherein said nitride layer is abraded with diamond grit before depositing said diamond layer on said nitride layer.

* * * * *